United States Patent [19]

Shiga

[11] Patent Number: 5,274,256
[45] Date of Patent: * Dec. 28, 1993

[54] MICROWAVE FET

[75] Inventor: Nobuo Shiga, Yokohama, Japan

[73] Assignee: Sumitomo Electric Industries, Ltd., Osaka, Japan

[*] Notice: The portion of the term of this patent subsequent to Dec. 3, 2008 has been disclaimed.

[21] Appl. No.: 943,117

[22] Filed: Sep. 10, 1992

Related U.S. Application Data

[63] Continuation of Ser. No. 631,972, Dec. 21, 1990, abandoned.

[30] Foreign Application Priority Data

Jan. 8, 1990 [JP] Japan .................. 2-1272

[51] Int. Cl.$^5$ .............................. H01L 29/80
[52] U.S. Cl. ................... 257/270; 257/275; 257/280
[58] Field of Search ............ 357/22 H, 22 I; 257/270, 275, 280, 281

[56] References Cited

U.S. PATENT DOCUMENTS

| | | | |
|---|---|---|---|
| 4,313,126 | 1/1982 | Krumm et al. | 357/22 H |
| 4,315,272 | 2/1982 | Vorhaus | 357/22 H |
| 4,609,889 | 9/1986 | Kumar | 357/22 H |
| 4,611,184 | 9/1986 | Kunmar | 357/22 H |
| 4,734,751 | 3/1988 | Hwang et al. | 357/22 H |
| 5,070,376 | 12/1991 | Shiga | 357/22 |

FOREIGN PATENT DOCUMENTS 0081396 6/1983 European Pat. Off. .
0189597 8/1986 European Pat. Off. .

OTHER PUBLICATIONS

Furutsuka et al., "GaAs Dual-Gate MESFET's" IEEE Transactions on Electron Devices, vol. ED-25, No. 6, Jun. 1978, pp. 580-586.

Liechti, "Microwave Field-Effect Transistors-1976", IEEE Transactions on Microwave Theory and Techniques, vol. MTT-24, No. 6, Jun. 1976, pp. 279-299.

Conference Proceedings-4th European Microwave Conference, Sep. 10-13, 1974 pp. 87-90 "Characteristics of Dual-Gate GaAs Mesfets" by Charles A. Liechti.

Patent Abstracts of Japan vol. 7, No. 27, Feb. 3, 1983 and Japanese pending appl. 57-181169, NEC Corp.

Patent Abstracts of Japan, vol 11, No. 117, Apr. 11, 1987, and Japan. appl. 61-263249 (Natl. Aeronautics & Space).

Primary Examiner—Ngan Ngo
Attorney, Agent, or Firm—Beveridge, DeGrandi, Weilacher & Young

[57] ABSTRACT

In a dual gate FET of this invention, the number of points for supplying a signal to a first gate electrode and the number of points for supplying a signal to a second gate electrode are set to be optimal values so that a noise index is minimized. A difference in the electrical length between each signal supply point of each of the first and second gate electrodes and the corresponding gate input terminal has a negligible magnitude with respect to one quarter of the wavelength of an input signal applied to the corresponding gate input terminal. The dual gate FET has a low-noise arrangement, and a microwave can be applied to either one of the first and second gate electrodes, thereby obtaining, e.g., a low-noise mixer. In this case, a separator required upon use of a single gate FET can be omitted, thereby easily arranging a monolithic IC.

10 Claims, 4 Drawing Sheets

MICROWAVE FET

This application is a continuation of application Ser. No. 07/631,972 filed Dec. 21, 1990, now abandoned.

BACKGROUND OF THE INVENTION

1. Field of the Invention

The present invention relates to a field effect transistor (FET) operated in a microwave band and, more particularly, to a dual gate microwave FET.

2. Related Background Art

A conventional known FET of this type has two gate electrodes aligned in a direction of gate length and is formed on a GaAs substrate (IEEE Transaction on Electron Devices, Vol. ED-22, No. 10 (1975), p. 897).

Only a DC wave or a low-frequency wave equivalent to the DC wave is applied to the second gate in a conventional dual gate microwave FET.

If a microwave can be applied to the second gate, a target conversion signal ($f_{RF}$) is applied to the first gate, and a local oscillation signal ($f_{OSC}$) is applied to the second gate to obtain a desired signal ($f_{IN}$) from the drain, thereby realizing a frequency converter (mixer), as shown in FIG. 1. To the contrary, as a method of realizing a single gate FET having the same function as the above frequency converter, a target conversion signal and a local oscillation signal are applied to the gate electrode. According to this method, however, a separator for separating these two signals from each other is required. In a frequency range exceeding microwaves, this separator is constituted by a transmission circuit. For this reason, a circuit scale is undesirably increased to make it difficult to provide a monolithic IC (integrated circuit). As another method of realizing a frequency converter by using a single gate FET, a target conversion signal is applied to the gate electrode, and a local oscillation signal is applied to the drain. According to this method, however, a circuit for separating the local oscillation signal from an output signal is required.

In order to realize a frequency converter by using a single gate FET, the circuit for separating the target conversion signal from the local oscillation signal or the local oscillation signal from the output signal is required.

To the contrary, if a dual gate FET can be used to arrange such a frequency converter, the separator is not required. In a conventional dual gate FET, however, the microwave cannot be applied to the second gate, as described above. In addition, a noise level of the dual gate FET is higher than that of the single gate FET.

SUMMARY OF THE INVENTION

It is an object of the present invention to provide a dual gate FET suitable for a frequency converter used in a microwave range.

In order to achieve the above object of the present invention, there is provided a dual gate FET wherein the number of points for supplying a signal to a first gate electrode and the number of points for supplying a signal to a second gate electrode are set to be optimal values so that a noise index is minimized, and a difference in electrical length between an input terminal and the respective signal supply points has a magnitude negligible with respect to a quarter wavelength of a gate input signal.

The FET noise index is known to be reduced when a gate resistance and a gate capacitance are reduced. In a microwave FET having a gate width as large as, e.g., 300 μm, the gate resistance is reduced when the number of points for supplying signals to the gate electrode (theoretically in inverse proportion to the square of the number of signal supply points), but the gate capacitance is increased. There is an optimal signal supply point at which the noise index is minimized in accordance with a balance between the gate resistance and the gate capacitance. The optimal signal supply point value varies depending on the types of material and the structures of FETS, but generally falls within the range of about 3 to 7. According to the present invention, the signal supply points for the first and second gates are optimized to minimize the noise index.

Since an element size in a microwave circuit cannot generally be neglected with respect to a wavelength, the circuit is designed in consideration of the wavelength. That is, in order to apply a microwave signal to the gate electrode and control the gate electrode, a signal applied to the gate input terminal must reach the respective signal supply points in the same phase. If a difference in electrical length between two signal supply points and the second gate input terminal corresponds to a quarter wavelength of an input signal, when the input signal reaches the respective signal supply points, a phase difference of 90° ($\pi/2$) occurs. For example, when a voltage magnitude (absolute value) is zero at one signal supply point, a voltage magnitude is maximum at the other signal supply point. In this manner, states at these signal supply points are inverted from each other. A systematic control effect cannot be obtained as a whole. To the contrary, according to the present invention, the difference in electrical length has a negligible magnitude with respect to the quarter wavelength of the input signal. Therefore, the signal can reach the respective signal supply points in almost the same phase. Therefore, it is possible to effectively utilize a control effect of the second gate electrode in a microwave range. For example, the wavelength of an electrical signal (electromagnetic wave) is shorter on a dielectric substrate such as a GaAs substrate than in a vacuum. In a microstrip line on a GaAs substrate, an X band range (frequency: about 10 GHz) used in, e.g., satellite communication is about 8 to 10 mm. This reduction in wavelength varies depending on a dielectric constant of a substrate and a structure of a transmission line, e.g., a coaxial cable or microstrip line, as a matter of course.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 3:
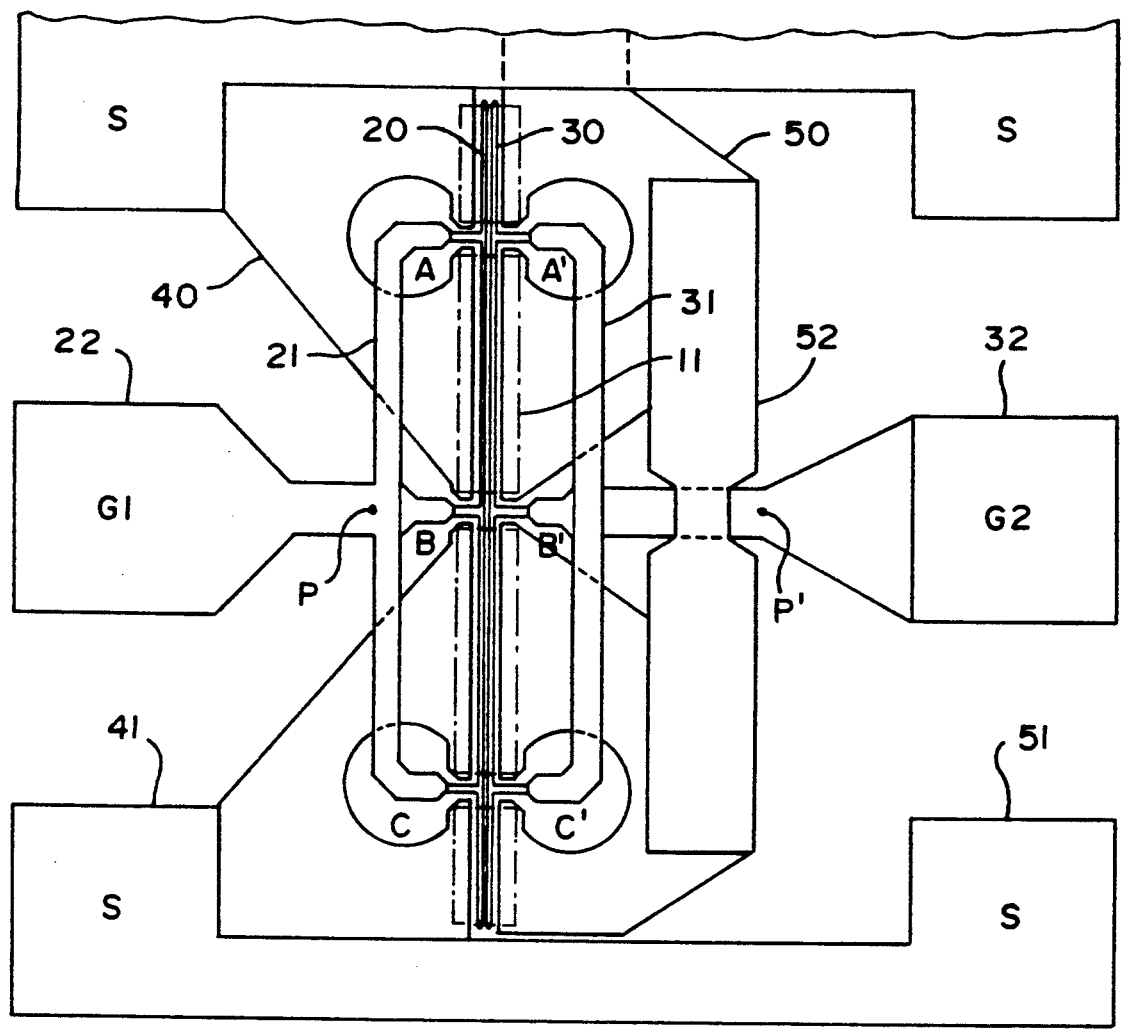
FIG. 3 is an enlarged view of a central section of FIG. 2.
Figure 4A:
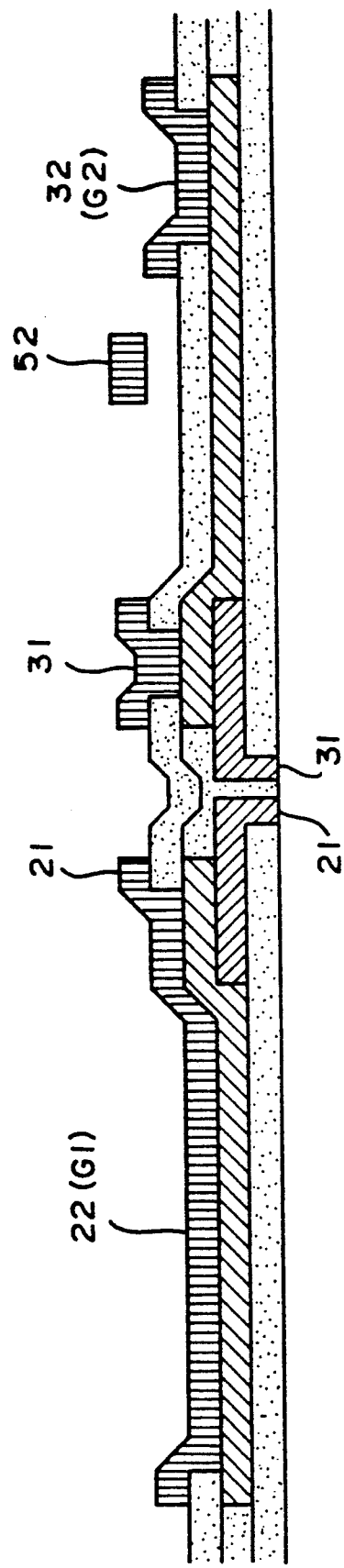
FIG. 4A is a cross-sectional view looking at feed points B and B' of the embodiment of FIG. 2.
Figure 4B:
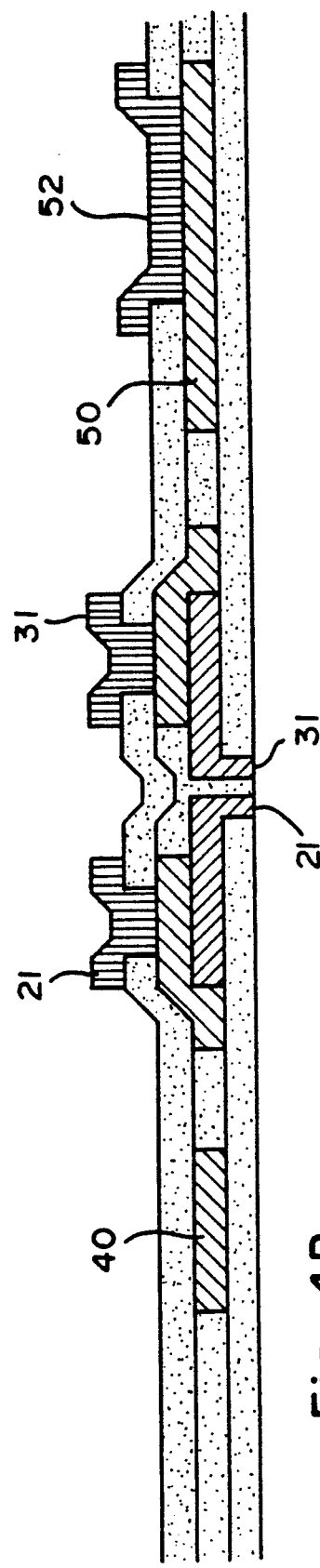
FIG. 4B is a cross-sectional view looking at feed points A and A' of the embodiment of FIG. 2.

An embodiment of the present invention is now explained with reference to FIGS. 2 through 4.

FIG. 2 through 4B show a structure of an FED 1 according to an embodiment of the invention. Electrodes and wiring patterns of the FET are viewed from the top, and an insulating interlayer and the like are not pointed out. A first gate electrode 20, a second gate electrode 30, a source electrode/wiring layer 40, and a drain electrode/wiring layer 50 are formed on a semi-insulating substrate made of GaAs.

The first gate electrode 20 is connected to a first gate input terminal (pad) 22 through a lead wiring pattern 21 at three signal supply points (A, B, and C). Similarly, the second gate electrode 30 is connected to a second gate input terminal 32 through a lead wiring pattern 31 at three signal supply points (A', B', and C'). The signal supply points of the second gate electrode 30 are symmetrical with those of the first gate electrode. The numbers of signal supply points are selected to be optimal values so that a noise index is minimized.

The second gate input terminal 32, the signal supply points of the second gate electrode 30, and the lead wiring pattern 31 for connecting the second gate input terminal 32 and the signal supply points are arranged so that a difference in electrical length between each signal supply point and the second gate input terminal 32 has a negligible magnitude with respect to one quarter of a wavelength of a second gate input signal. More specifically, the three signal supply points of the second gate electrode 30 in this embodiment are symmetrical about a central line obtained by dividing the second gate electrode 30 into halves at the center in the direction of gate width. The difference in electrical length between the end signal supply point A' and the second gate input terminal 32 is equal to that between the end signal supply point C' and the second gate input terminal 32. The difference in electrical length between the central signal supply point B' and the second gate input terminal 32 is slightly smaller than that between each end signal supply point and the second gate input terminal 32. However, the difference in electrical length between the second gate input terminal 32 and the end and central signal supply points is less than one tenth (about 200 $\mu$m) of less of a quarter wavelength of a 10-GHz signal.

A phase difference caused when a microwave signal applied to the second gate input terminal 32 reaches the respective signal supply points can be neglected. It is, therefore, possible to utilize a microwave as a control signal applied to the second gate electrode 30.

Figure 1:
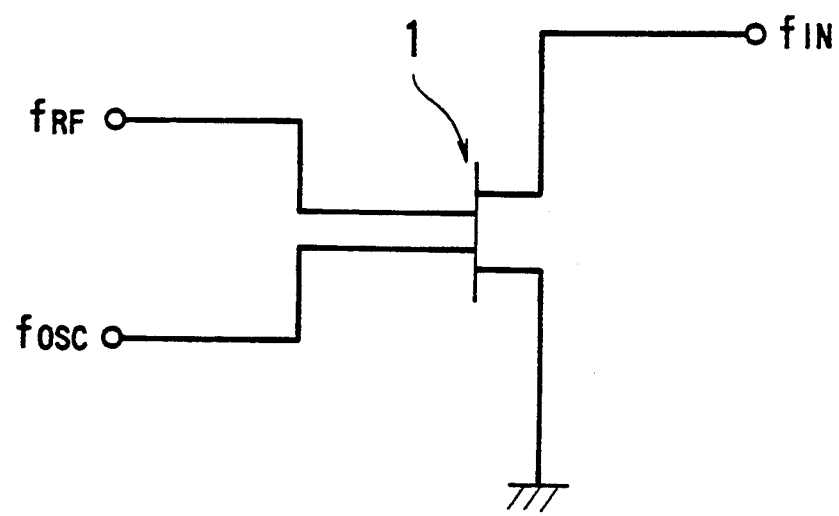
FIG. 1 is a circuit diagram of a frequency converter using a dual gate FET.
Figure 2:
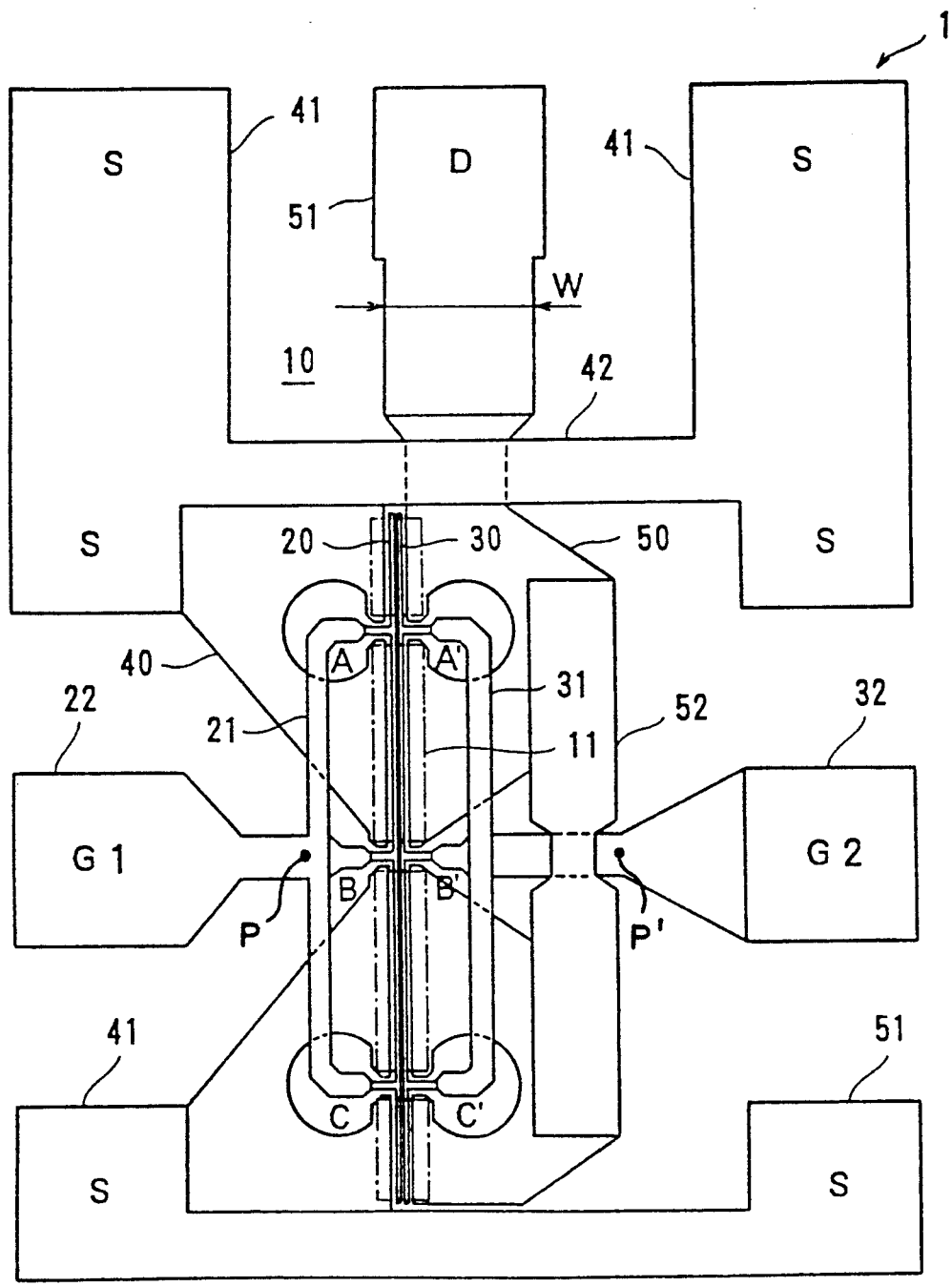
FIG. 2 is a plan view showing an FET according to an embodiment of the present invention.

The first and second gate electrodes 20 and 30 form Schottky junctions on an active layer 11 indicated by the alternate long and short dashed line in FIG. 2. The source and drain electrodes are in ohmic contact with n$^+$-type regions formed at both sides of the gate electrodes. The source and drain electrodes can be formed by an underlying wiring layer and are connected to upper terminals 41 and 51 through contact holes. A drain wiring layer 52 intersecting with the lead wiring pattern 31 of the second gate electrode 30 and a source wiring layer 42 intersecting with the drain wiring layer 50 are formed by the upper wiring layer.

The first and second gate and drain terminals (pads) 22, 32, 41, and 51 are arranged to have sizes and pitches (pad size: 70 to 100 $\mu$m; pitch: 150 $\mu$m) so that they are probed by a microwave wafer prober available from CASCADE MICRO TEC Corp. Therefore, measurements for modeling necessary for circuit design can be easily performed. A width W of the lead wiring pattern connected to the drain has a size (about 70 $\mu$m given when a 100-$\mu$m thick GaAs substrate 10 is used) so that its characteristic impedance is set to be 50 $\Omega$ in consideration of matching with a measuring system.

A low-noise mixer shown in FIG. 2 can be arranged by using the FET 1 of this embodiment.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A microwave FET comprising:
   a source electrode;
   a drain electrode positioned to face to said source electrode;
   a first gate electrode located between said source electrode and said drain electrode, said first gate electrode extending in a straight line and having a plurality of first signal feed points thereon;
   a first gate terminal to which a first gate signal can be applied;
   first electrical lead wires respectively connecting said first gate terminal to said signal feed points of said first gate electrode, said first lead wires having different lengths, each of said lengths thereof being measured from a point on said first gate terminal to different of said signal feed points of said first gate electrode;
   a second gate electrode located between said source electrode and said drain electrode, said second gate electrode extending in a straight line and having plurality of second signal feed points thereon;
   a second gate terminal to which a second gate signal can be applied; and
   second electrical lead wires respectively connecting said second gate terminal to said second signal feed points of said second gate electrode, said second lead wires having different lengths, each of said different lengths being measured from a point on said second gate terminal to different of said second signal feed points of said second gate electrode;
   said first electrical lead wires having a minimum length from one of said feed points of said first gate electrode to said point on said first gate terminal and a maximum length from another of said feed points to said point on said gate terminal such that a difference between said minimum length and said maximum length of said first lead wires is shorter than one quarter of a wavelength of a first gate signal applied to said first gate terminal, and
   said second electrical lead wires having a minimum length from one of said feed points of said second gate electrode to said point on said second gate terminal and a maximum length from another of said feed points to said point on said gate terminal such that a difference between said minimum length and said maximum length of said second lead wires is shorter than one quarter of a wavelength of a second gate signal applied to said second gate terminal.

2. An FET according to claim 1, wherein a predetermined number of said first signal feed points and a predetermined number of said second signal feed points are provided whereby a noise index of said FET is minimized.

3. An FET according to claim 2, wherein said difference between said minimum length and said maximum length of both of said first lead wires and said second lead wires is shorter than one tenth of one quarter of the wavelength respectively of a first gate signal applied to said first gate input terminal, and a second gate signal applied to said second gate input terminal.

4. An FET according to claim 3, wherein said first signal feed points and said second signal feed points are arranged symmetrically with respect to center points of said first and second gate electrodes in a direction of gate length, respectively.

5. An FET according to claim 4, wherein a width of a lead wire in the drain electrode is set to provide a predetermined impedance.

6. A frequency converter having a microwave FET, said microwave FET comprising:

a source electrode;

a drain electrode positioned to face to said source electrode;

a first gate electrode located between said source electrode and said drain electrode, said first gate electrode extending in a straight line and having a plurality of first signal feed points thereon;

a first gate terminal to which a first gate signal can be applied;

first electrical lead wires respectively connecting said first gate terminal to said signal feed points of said first gate electrode, said first wires having different length, each of said lengths being measured from a point on said first gate terminal to different of said signal feed points of said first gate electrode;

a second gate electrode located between said source electrode and said drain electrode, said second gate electrode extending in a straight line and having a plurality of second signal feed points thereon;

a second gate terminal to which a second gate signal can be applied; and second electrical lead wires respectively connecting said second gate terminal to said second signal feed points of said second gate electrode and having different lengths measured from a point on said second gate terminal to said second signal feed points of said second gate electrode, said first electrical lead wires having a minimum length from one of said feed points of said first gate electrode to said point on said first gate terminal and a maximum length from another of said feed points to said point on said gate terminal such that a difference between said minimum length and said maximum length of said first lead wires is shorter than one quarter of a wavelength of a first gate signal applied to said first gate terminal, and said second electrical lead wires having a minimum length from one of said feed points of said second gate electrode to said point on said second gate terminal and a maximum length from another of said feed points to said point on said second gate terminal such that a difference between said minimum length and said maximum length of said second lead wires is shorter than one quarter of a wavelength of a second gate signal applied to said second gate terminal, wherein said first gate terminal is adapted for receiving a signal to be converted, said second gate terminal is adapted for receiving a local oscillation signal, and said drain electrode is adapted for supplying an output signal.

7. A circuit according to claim 6, said wherein a predetermined number of said first signal feed points and a predetermined number of said second signal feed points are provided whereby a noise index of said FET is minimized.

8. A circuit according to claim 7, wherein said difference between said minimum length and said maximum length of both of said first lead wires and said second lead wires is shorter than one tenth of one quarter of the wavelength respectively of a first gate signal applied to said first gate input terminal, and a second gate signal applied to said second gate input terminal.

9. A circuit according to claim 8, wherein said first signal feed points and said second signal feed points are arranged symmetrically with respect to center points of said first and second gate electrodes in a direction of gate length, respectively.

10. A circuit according to claim 9, wherein a width of a lead wire in the drain electrode is set to provide a predetermined impedance.

* * * * *